DIODE ARRAY AND PROCESS FOR MAKING SAME

Original Filed Sept. 29, 1961 2 Sheets-Sheet 1

INVENTORS
Clarence J. Carter,
Richard F. Stewart

BY
Stevens, Davis, Miller & Mosher
ATTORNEYS

INVENTORS
Clarence J. Carter,
Richard F. Stewart

BY
Stevens, Davis, Miller & Mosher
ATTORNEYS

United States Patent Office 3,382,115

Patented May 7, 1968

3,382,115
DIODE ARRAY AND PROCESS FOR MAKING SAME

Clarence J. Carter, Rolling Hills Estate, and Richard F. Stewart, Los Angeles, Calif., assignors to Texas Instruments Incorporated, Dallas, Tex., a corporation of Delaware

Continuation of application Ser. No. 141,854, Sept. 29, 1961. This application June 30, 1965, Ser. No. 468,276

7 Claims. (Cl. 148—187)

This is a continuation application of our copending application, Ser. No. 141,854, filed Sept. 29, 1961, now abandoned.

This invention relates to a process of making a diode array on the surface of a slab or wafer of semiconductor material and to the product resulting from this process.

In the field of radar telescopy there is need for an array of a large number of diodes spaced very close together. Such an array of diodes would be useful to detect microwave energy focused by the lens system of a radar telescope. To carry out this detection with individual existing diodes assembled together into an array would be impractical because of the large number of diodes needed. On the order of one-half million diodes are required in the array. Also the physical size of such diodes would make the resolution obtained by an assembled array very poor. In view of the foregoing and other difficulties, it has not been possible to date to devise a diode array that is satisfactory for radar telescopy work.

This invention, however, provides a way to overcome the difficult and tedious problems that have plagued those laboring in this field, and provides a successful diode array. This is essentially accomplished by utilizing an integral diode array, sensitive to microwave energy, that is formed on the surface of a slab or wafer of silicon. The wafer of silicon is characterized with a high resistivity to prevent microwave losses and to prevent the diodes themselves from being shorted out. Whereas the use of high purity silicon is suggested for this purpose, such silicon is hard to get and expensive, especially in the amount contemplated. To overcome this problem, a material that has an energy level that lies deep in the forbidden energy band is diffused as an impurity material into the silicon. The addition of this material drives the silicon to a very high resistivity and in this way a lower purity silicon can be used as a raw material and the desired high resistivity can still be obtained. The preferred material for this purpose is gold. Iron or copper could also be used, but they do not work as well as gold. The diodes are formed on the silicon in unique ways as will become more apparent from the detailed description appearing hereinafter.

It is, accordingly, an object of the present invention to provide a novel diode array that is especially adapted for radar telescopy.

It is a further object of the invention to provide a unique method for producing a diode array for radar telescopy whereby an extraordinary number of diodes can be arranged compactly on a surface to obtain good resolution of impinging signals on the diode array.

It is still another object of the invention to provide a diode array than can be readily manufactured economically and efficiently.

Further objects and advantages of the invention will become readily apparent from the following detailed description of a preferred embodiment of the invention and when taken in conjunction with the following drawings wherein.

Figure 1:
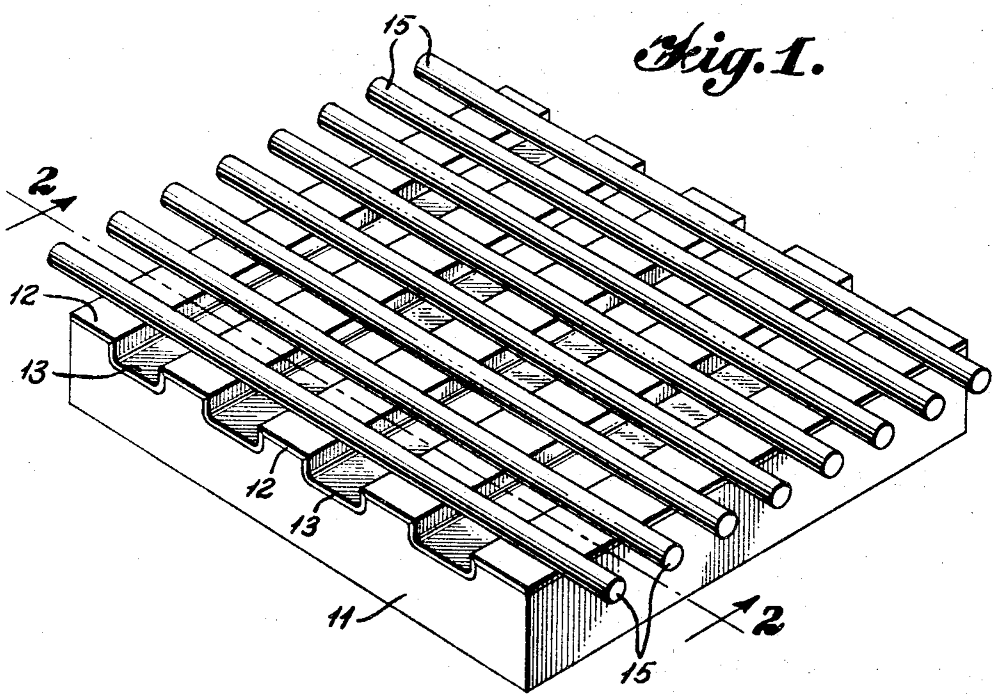
FIGURE 1 shows a silicon wafer as it appears during processing.

According to the invention, the diode array is formed on a silicon wafer or slab which may by way of example be about one inch square and 0.050 inch thick. In accordance with the principles of this invention, the silicon must possess a high resistivity as in use of the finished diode array. The energy (microwave type) will pass through the wafer before striking the PN junction areas formed in one face of the wafer. In this way, contacts and leads can be freely attached to the face of the wafer in which the junction areas are formed without danger of creating microwave losses. The high resistivity of the silicon wafer is essential to avoid microwave losses.

To achieve the requisite high resistivity, one would ordinarily conceive of using ultra high purity, zone refined silicon. Whereas the use of this material would be more than acceptable from a technical standpoint, viewed from economy, its use would be prohibitive. Thus the invention has sought and found a way of procuring silicon of necessary resistivity without incurring the expense one would normally associate with this achievement. High resistivity silicon satisfactory for this invention is produced by gold plating the silicon wafer and thereafter diffusing the gold plating into the wafer at a temperature of about 800° C. for about 24 hours. This diffusion of gold increases the resistivity of the silicon in the order of a few thousand ohm-centimeter or more. It has been found that gold has the property of compensating for any impurities contained in the silicon. The gold establishes recombination centers in the silicon crystal and thus decreases the lifetime of the carriers and would not normally suggest itself as being a good material to be added to the silicon. However, in the application of microwave detection, the lifetime of the carriers is not an important consideration. It is not important whether the silicon has a high, medium or low resistivity initially, as the addition of gold will drive the silicon to a very high resistivity. Consequently, a lower purity silicon may be used as a raw material and a high resistivity still be obtained.

Iron or copper could be used instead of gold but these elements do not work as well. The diffused material should have an energy level that lies deep in the forbidden band, whereas the normal impurities added to a semiconductor crystal lie very close to either the conduction or the valence band. Such normal impurities would include B, Al, Ga, In, P, As, Sb, etc. Gold has several levels but all of them are close to the middle of the forbidden band and as a result, gold would have to be heated considerably before it would contribute to the conductivity of the parent material. The amount of gold needed for the diffusion is very minute as the concentration achieved is about $10^{-5}$ to $10^{-6}$ parts to one part of the semiconductor material.

After the above-described diffusion process, the excess gold is removed and one surface of the wafer is lapped flat. Grooves are then cut into this surface to a depth of three to five mils to form ridges and valleys of substantially equal width. The cutting of these grooves is carried out by placing four strips of tape on the lapped surface parallel to each other and then, using the tape as a mask, forming the grooves by sand blasting. The tapes employed were made of Teflon, although any thin tape could be suitably used so long as the proper mechanical masking were provided. After sand blasting, the wafer is etched with a fast etch material, such as CP-4, which comprises hydrofluoric acid, nitric acid, acetic acid and a small amount of bromine, to remove the rough surfaces caused by the sand blasting and to remove the surface region exhibiting mechanical strain. This step insures that the diffusing step which takes place next will not be preferential along strain lines, cracks, or the like. Instead of being etched, the wafers could be polished with a suitable brass or cast iron material.

Following the etching step, phosphorous from the vapor state is diffused into the surface of the solid state wafer in an open tube process. This diffusion is carried out in an oxygen atmosphere at a temperature of 1300° C. for a period of 30 minutes. As a result, an air-tight layer of N-type material is formed in the valleys or grooves and on the ridges or lands of the wafer to a depth of about .0003 inch. The oxygen atmosphere produces a layer of oxide on the surface of the diffused layer. The phosphorous doped material is then removed or cut away from the top of the ridges or lands by lapping and mechanical polishing leaving an N-type layer covered with oxide in the valleys or grooves. This lapping and polishing operation is carried out by using a fairly coarse grinding compound to remove a layer of about .001 inch thick and then using a very fine polishing compound such as cerium oxide polish to produce a good optical polished surface. Following the polishing operation, the wafer is washed and then boron is diffused into the wafer. This boron diffusion is carried out at a temperature from 1200° to 1250° C. for a period of from 15 to 30 minutes in a dry oxygen atmosphere. The boron diffuses into the ridges and forms a layer of P-type material on each of the ridges from .0002 to .0004 inch thick. The oxide coating on the N-type material in the valleys provides a partial masking against the boron diffusion. Thus, after this step of boron diffusion, there are alternate strips of P and N-type material corresponding to the ridges and valleys on the wafer surface. The steps of phosphorous diffusion and boron diffusion are controlled so that the boron concentration in the layers on the ridges is less than the phosphorous concentration in the layers in the valleys in order to get good junctions. This difference in the diffusion steps helps offset the partial diffusion of boron into the phosphorous doped layers in the valleys.

Figure 2:
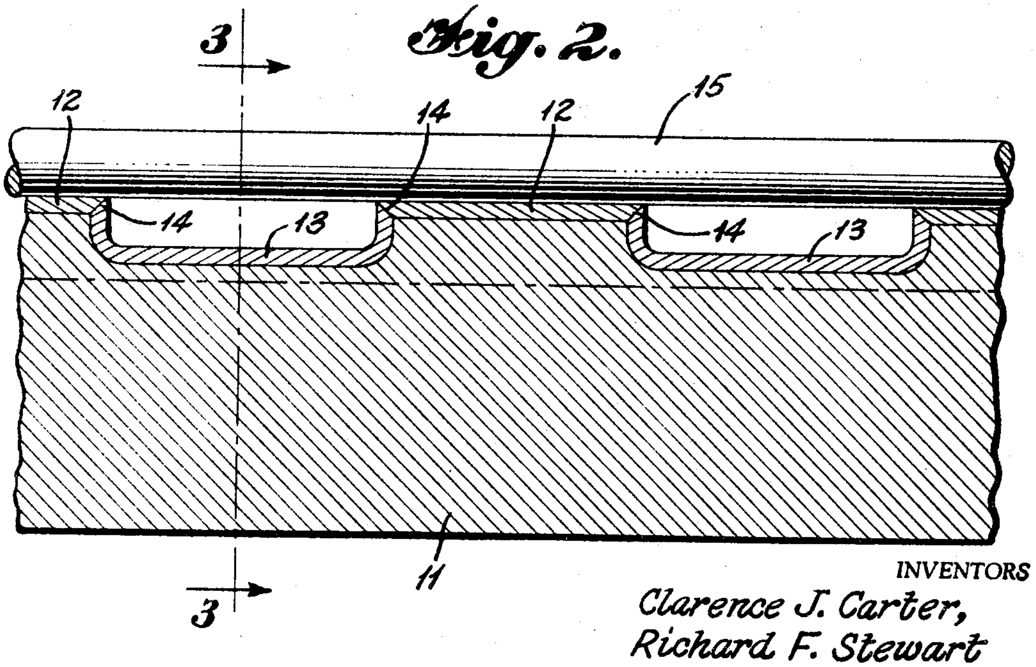
FIGURE 2 is a view in section taken along line 2—2 of FIGURE 1.

In FIGURES 1 and 2, which illustrate the wafer after the diffusion steps, the reference numeral 11 designates the wafer. The layers 13 of N-type material cover the valleys and extend up to the corners of the ridges. The layers 12 of P-type material extend over the top of the ridges. Diode junctions 14 are formed at the intersection of the layers 12 and 13. The exact position and shape of the junctions is not known but they occur somewhere near the corners of the ridges.

Figure 3:
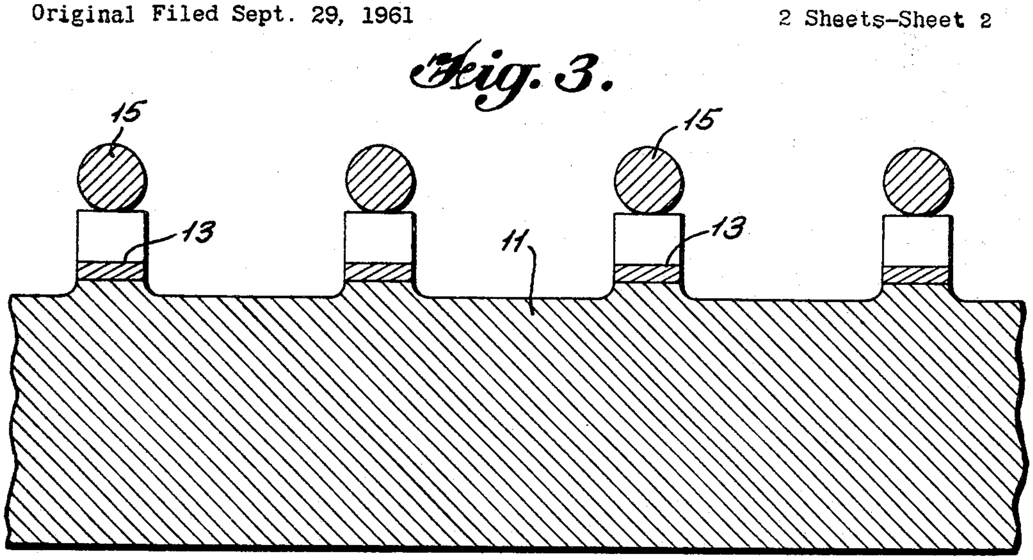
FIGURE 3 is a view in section taken along line 3—3 of FIGURE 2.

After the step of diffusing boron, small wires are stretched across the grooved surface of the wafer 11 in contact with the ridges and perpendicular to the direction of the laterally extending ridges and grooves. The wires 15 are about .010 inch in diameter. After the wires 15 are positioned as shown in FIGURES 1 and 2, the grooved surface is again sand blasted to cut below the surface layers 12 and 13. The wires 15 provide a mechanical mask in the sand blasting and as a result grooves are cut between the wires 15 leaving lands in the shadows of the wires. FIGURE 3 illustrates a cross section of the wafer perpendicular to the cross section shown in FIGURE 2 after this second sand blasting operation has taken place. As shown in FIGURE 3, the grooves cut between the wires 15 extend below the strips or layers 13 of N-type material.

Figure 4:
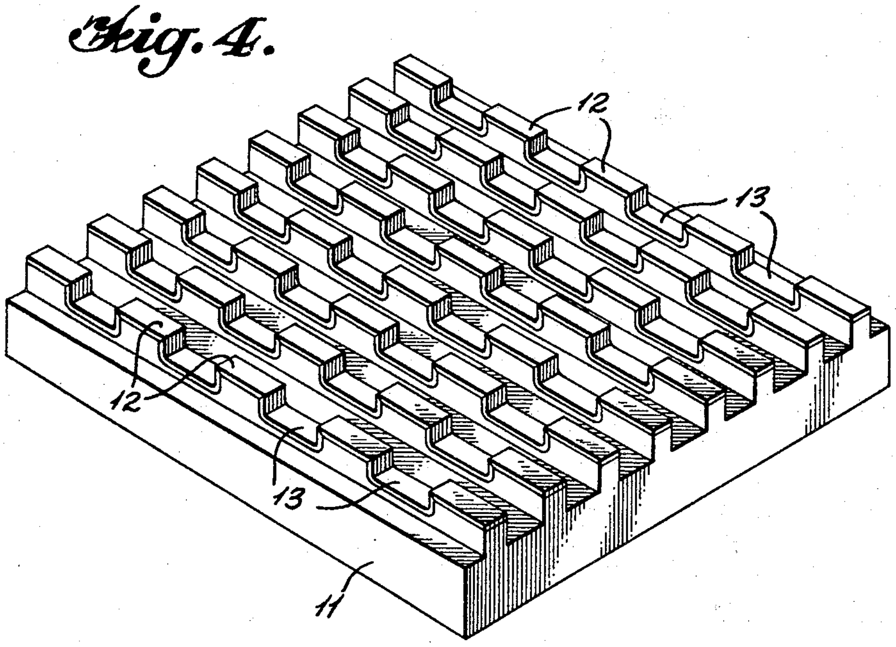
FIGURE 4 shows the finished product.

The resulting product, shown in FIGURE 4, comprises eight strips of doped material on the silicon wafer 11 with each strip comprising alternate layers 12 and 13 of N and P-type material. There are eight diodes (four back-to-back diodes) fabricated on each strip so 64 diodes in all are formed. In order for these diodes to be good microwaves detectors, they must have a low shunt capacitance and a low resistivity. The shunt capacitance is made low by making the area of the diode small which is accomplished by the wire masking and sand blasting techniques. Also the shunt capacitance is decreased by having a high resistivity material on each side of the diode. Ordinarily this desire for high resistivity material on each side of the diode would be in opposition to the need for low resistivity diodes. However, by using the base material with gold diffused therein, the two extremes are obtained. The diffused gold causes the base material to have a high resistivity and the diodes themselves to have a low resistivity. The high resistivity base material used also enables the diodes to operate effectively as if they were isolated from each other.

The width of the wire used in the sand blasting operation controls the width of the strip of diodes and thus controls the impedance of the diodes. Thus, the impedance of the diodes may be selected to match the impedance of the incoming microwaves.

Instead of the sand blasting steps described above, photo-resist masking and etching could be used to cut the grooves. Photo-resist is a photographic plastic material that would be applied to the surface. Then those parts of the surface which it is desired to mask are exposed to ultraviolet light which hardens the material. The hardened material then serves as a mask in the etching process.

As will be evident from the above, 64 diodes are produced in an area 1 inch square or less. The wafers which are produced by this process can then be mounted to completely cover one hemisphere of a Lunberg lens and the other hemisphere used as the collecting lens to focus microwave energy on the diode array. Approximately a quarter of a million diodes would be mounted on the one hemisphere of the lens and a satisfactory resolution would be obtained. By appropriately scanning the diodes such as by sequentially sampling their outputs, a picture can be built up on a suitable display device such as a cathode ray tube. It will probably be advantageous for the scanning to be subdivided into sectors and a plurality of independently scanning arrangements to be used each having its own associated CRT.

Many other modifications may be made to the above described preferred embodiment of the process and product without departing from the spirit and scope of the invention, which is limited only as defined in the appended claims.

What is claimed is:

1. A method for making semiconductor devices comprising the steps of:

(a) providing a monocrystalline semiconductor body having a plurality of grooves at selected first locations of a surface of said body and a plurality of lands of said grooves at selected second locations of said surface, (b) diffusing into said surface from an oxygen atmosphere containing phosphorus to change said surface to N-type conductivity and form a diffusion masking coating of oxide upon said surface, (c) selectively removing said diffusion masking coating of oxide and said changed N-type conductivity surface from the said lands of said grooves, thereby to leave a plurality of first diffused regions of N-type conductivity at said selected first locations of said surface, each of said plurality of first diffused regions extending to said surface beneath unremoved oxide, (a) diffusing boron impurities into said lands to form a plurality of second diffused regions of P-type conductivity adjoining the said plurality of first diffused regions of N-type conductivity at said surface, and (e) forming another plurality of grooves at said surface perpendicular to the original grooves to form a series of separated surface adjacent junction devices having their P-type conductivity region in juxtaposition with said N-type conductivity region at said surface.

2. A method for making semiconductor devices comprising steps of:

(a) forming a plurality of first diffused N-type conductivity regions beneath selected first locations of a surface of a monocrystalline semiconductor body, each of said plurality of first diffused N-type conductivity regions extending to said surface beneath oxide material, (b) selectively diffusing P-type conductivity impurities into exposed portions of said surface of said body at selected second locations of said surface outside of and in juxtaposition wtih said selected first locations, and (c) selectively removing portions of said surface to form a series of separated surface adjacent junction devices.

3. A method for fabricating a high frequency semiconductor device comprising the steps of:

(a) providing a high resistivity monocrystalline semiconductor body substantially free of conductivity determining type impurities therein.

(b) forming a plurality of first diffused regions of one conductivity determining type beneath selected first locations of a major face of said body, each of said plurality of first diffused regions extending to said major face beneath diffusion masking material upon said major face, and (c) selectively diffusing impurities of opposite conductivity determining type into exposed portions of said high resistivity monocrystalline semiconductor body at a plurality of selected second locations of said major face outside of and in juxtaposition with said selected first locations, thereby to provide surface adjacent PN junction areas at said major face.

4. A method for making a semiconductor device comprising the steps of:

(a) forming at least one region containing one conductivity determining type impurities at at least one select first location of a surface of a high resistivity semiconductor body substantially free of conductivity determining type impurities, and (b) selectively introducing impurities of opposite conductivity determining type into at least one select second location of said surface of said body to form a second region, said second region being outside of and in juxtaposition to said one region and both of said regions being oriented on said surface.

5. The method as described in claim 4 wherein said one region and said second region are formed by diffusion.

6. A method for making a semiconductor device comprising the steps of:

(a) forming at least one region containing one conductivity determining type impurities at at least one select first location of a major face of a high resistivity body of semiconductor material, said body being substantially free of conductivity determining type impurities, and (b) selectively forming at least one region containing opposite conductivity determining type impurities at at least one select second location of said major face, said at least one select second location being outside of and in juxtaposition with said at least one select first location.

7. In a method of making a plurality of surface-oriented semiconductor devices within a single body of high resistivity monocrystalline semiconductor material substantially free of conductivity determining type impurities, said body having a plurality of first diffused regions of one conductivity type beneath selected first locations of a major face of said body, each of said plurality of first diffused regions extending to said major face beneath a diffusion masking coating, the step of selectively diffusing impurities of opposite conductivity type solely into selected second locations outside of and in juxtaposition with said selected first locations along said major face, thereby to provide a plurality of surface-oriented semiconductor devices along said major face of said body.

References Cited

UNITED STATES PATENTS

| | | | |
|---|---|---|---|
| 3,083,441 | 4/1963 | Little | 148—189 X |
| 3,160,539 | 12/1964 | Hall | 148—1.5 X |
| 3,183,128 | 5/1965 | Leistiko | 148—187 |
| 2,860,218 | 1/1958 | Dunlap | 148—177 X |
| 2,981,877 | 4/1961 | Noyce | 148—187 X |
| 3,005,937 | 10/1961 | Wallmark | 148—33.2 X |
| 3,020,412 | 2/1962 | Byczkowski | 317—234 X |
| 3,022,568 | 2/1962 | Nelson | 148—1.5 X |
| 3,122,817 | 3/1964 | Andrus | 148—187 |
| 3,144,366 | 8/1964 | Rideout | 148—187 X |
| 3,183,129 | 5/1965 | Tripp | 148—189 X |
| 3,151,007 | 9/1964 | Dahlberg | 148—187 |

HYLAND BIZOT, *Primary Examiner.*